United States Patent [19]
Houk

[11] Patent Number: 5,812,010
[45] Date of Patent: Sep. 22, 1998

[54] SOFT-SWITCHING DRIVER OUTPUT STAGE AND METHOD

[75] Inventor: Talbott M. Houk, Culver City, Calif.

[73] Assignee: International Rectifier Corporation, El Segundo, Calif.

[21] Appl. No.: 711,165

[22] Filed: Sep. 9, 1996

[51] Int. Cl.[6] .............................. H03B 1/04; H03K 17/16
[52] U.S. Cl. .................... 327/381; 327/379; 327/387; 327/384; 327/108; 327/437; 326/27
[58] Field of Search .................... 327/427, 437, 327/384, 385, 379, 108, 311, 381, 110; 326/26, 27

[56] References Cited

U.S. PATENT DOCUMENTS 5,315,187  5/1994  Cheng ............................ 326/27

*Primary Examiner*—Timothy P. Callahan
*Assistant Examiner*—Dinh Le
*Attorney, Agent, or Firm*—Ostrolenk, Faber, Gerb & Soffen, LLP

[57] ABSTRACT

A circuit for and a method of driving first and second power transistors arranged in series in a half-bridge configuration provides for soft turn-on of the power transistors when there is a change of state in the input voltage. When the input voltage initially changes state, the gate drive voltage of one of the power transistors is raised to a voltage barely above its threshold value for a predetermined interval. The gate drive voltage of this power transistor is then raised to the supply voltage value. When the input voltage again changes state, the transistor is turned off, and the other transistor is turned on in a similar manner. As a result, when one of the transistors is turned on, current transients in the other transistor is reduced.

26 Claims, 11 Drawing Sheets

$$FRES = \frac{1}{2\pi\sqrt{L_s C_s}}$$

$$FRES = \frac{1}{2\pi\sqrt{L_s C_s}}$$

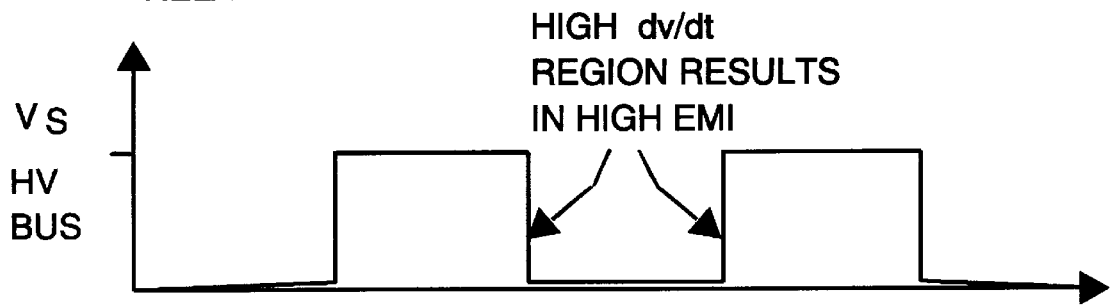
FIG. 5A
RELATED ART
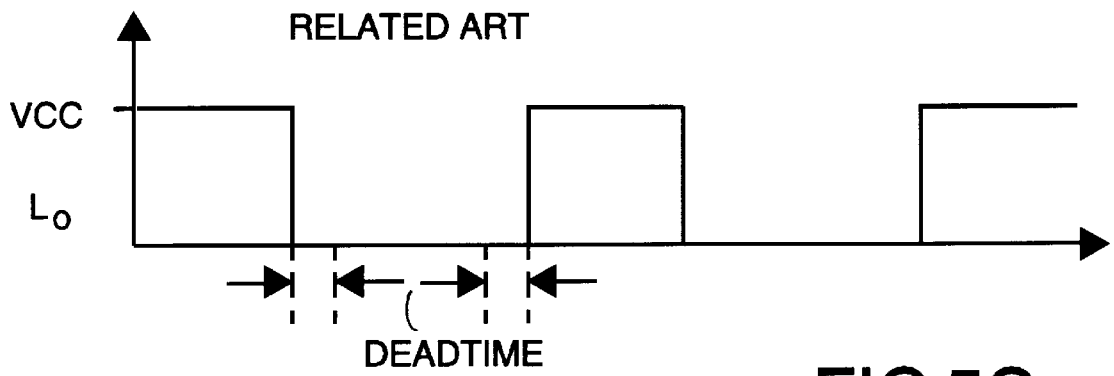
FIG. 5B
RELATED ART
FIG. 5C
RELATED ART
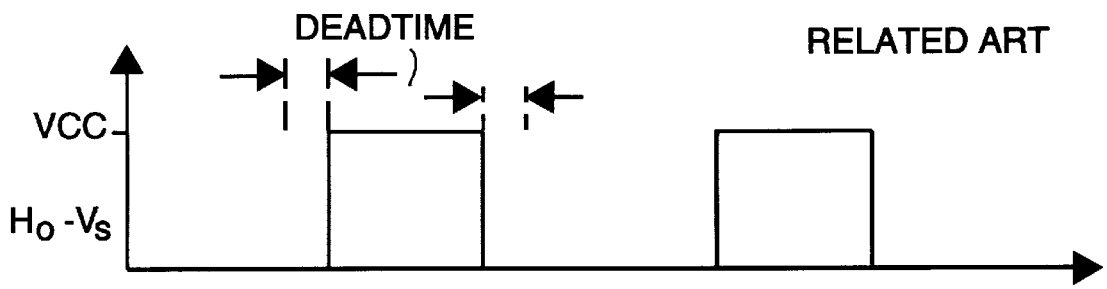
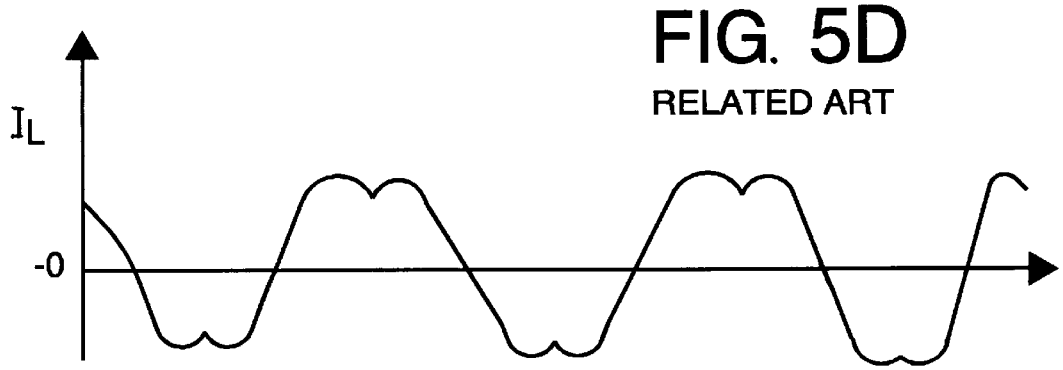
FIG. 5D
RELATED ART

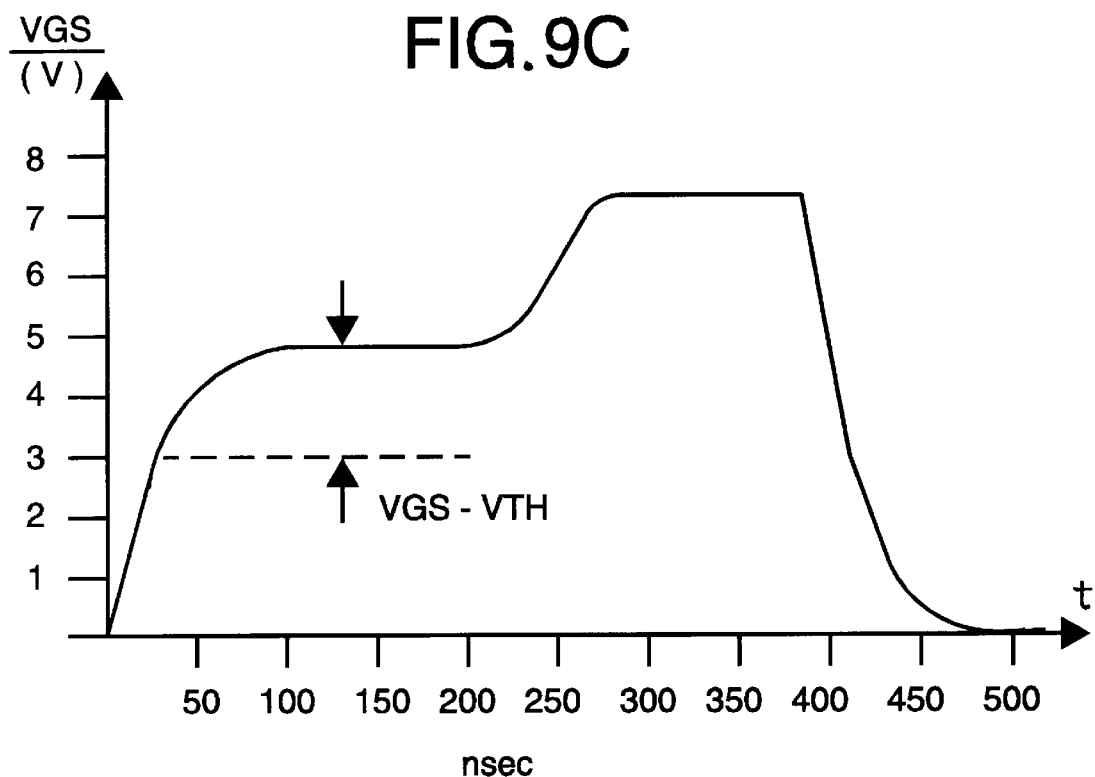
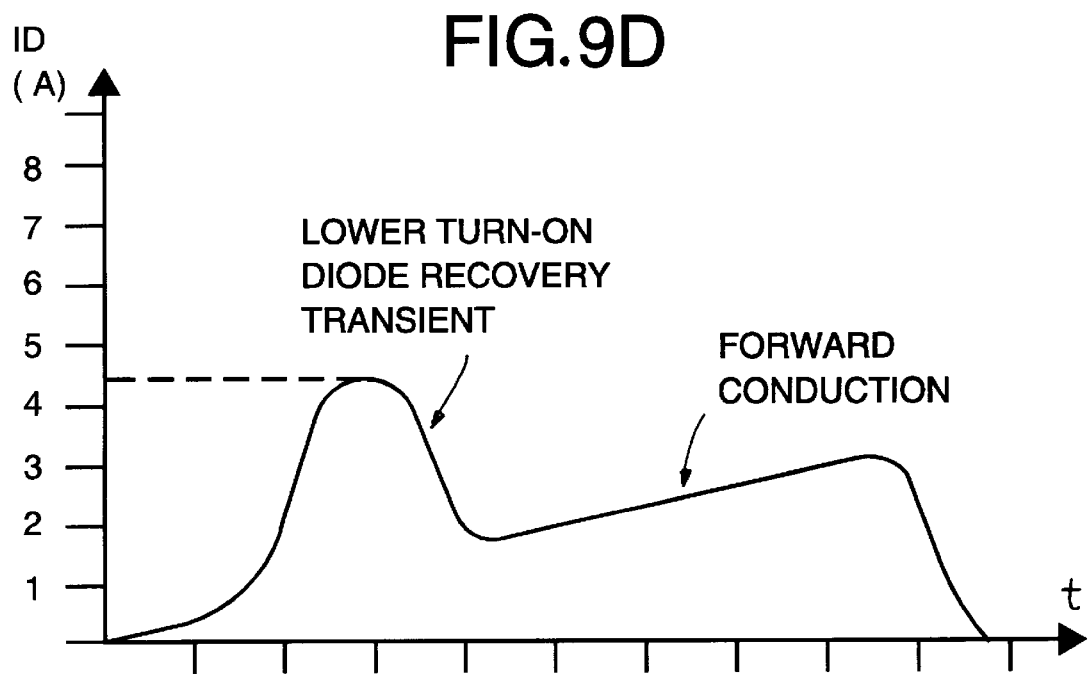

SOFT-SWITCHING DRIVER OUTPUT STAGE AND METHOD

This application claims the benefit of U.S. provisional application No. 60/008,705 filed on Dec. 15, 1995.

BACKGROUND OF THE INVENTION

The present invention is directed to power supply circuits and, more particularly, to a resonant-mode output stage of a power supply circuit that has improved reliability.

When the half-bridge output frequency of a resonant-mode power supply output stage falls below the series resonant load frequency, high current can flow through the output transistors. FIG. 1 shows an example of a known resonant-mode power supply output drive configuration. The power MOSFET transistors 101 and 102, combined with their driver integrated circuit 103, form a half-bridge inverter circuit that drives a series resonant load circuit having inductance $L_S$ and capacitance $C_S$. Capacitors 104 and 105 form a "snubber" or electromagnetic interference (EMI) filter for the inverter circuit. The resonant frequency of the load circuit is a function of the values of $L_S$ and $C_S$ according to the following relation:

$$f_{res} = \frac{1}{2\pi \sqrt{L_S C_S}} \quad (1)$$

FIG. 2 illustrates the impedance characteristics of a resonant-mode power supply circuit. The load impedance is at a minimum at the resonant frequency, i.e., the frequency at which power transfer to the secondary-based load circuit is at a maximum. When the operating frequency is lower than the resonant frequency, the load impedance is capacitive, whereas when the operating frequency is greater than the resonant frequency the load impedance is inductive. Preferably, the operating frequency of the circuit is greater than the resonant frequency.

Under normal operating conditions, the half-bridge output frequency always exceeds the resonant frequency so that zero-voltage switching occurs, thereby minimizing power losses in the converter circuit. FIGS. 3A–3D show the typical switching waveforms of the resonant-mode power supply for zero-voltage switching. Particularly, FIG. 3A shows the voltage supplied to the center tap of the totem pole or half-bridge connected MOSFETs 101 and 102 of FIG. 1, FIG. 3B shows the low-side MOSFET 102 gate drive signal, FIG. 3C shows the high-side MOSFET 101 gate drive signal, and FIG. 3D shows the current drawn by the load.

As FIG. 3D shows, the energy stored in the load inductor $L_S$, shown in FIG. 1, causes the output voltage to change polarity when one of the power MOSFETs 101 and 102 is turned off. When coupled with a built-in "dead-time" between the low-side (MOSFET 102) and high-side (MOSFET 101) gate drive signals, shown in FIGS. 3B and 3C, respectively, the stored energy generates a relatively small voltage drop across a respective one of the power MOSFETs when the respective MOSFET is turned on. This switching is known as "zero-voltage switching" and results in reduced switching losses in the power transistors.

FIGS. 4A–4B show in greater detail the drain current and voltage characteristics of zero-voltage switching. When one of the power MOSFETs is turned on, current flows through the integral body diode of the MOSFET and therefore only a small drain-to-source voltage is formed across the MOSFET, namely the forward voltage of the body diode. The zero-voltage switching scheme therefore reduces switching losses and lowers EMI noise.

When the output frequency is less than the resonant frequency, however, the corresponding switching waveforms are different than when the output frequency is greater, as FIGS. 5A–5D show, and the power losses in the output transistors likewise increase dramatically. The phase relationship between the output voltage $V_S$ shown in FIG. 5A and the load current $I_L$ results in hard switching.

Furthermore, large drain current transients flow through a power MOSFET when one of the MOSFETs is turned on or turned off, as shown in FIG. 6A. In addition, when one of the power MOSFETs is turned on, the drain-to-source voltage of the respective MOSFET is high and greatly increases the switching losses, as shown in FIG. 6B. Under these conditions, the power MOSFETs can fail when turned off.

The large current transients are a function of the phase relationship between the drain current and the drain-to-source voltage of the respective MOSFET. As FIGS. 6A–6B show, the drain current and source-to-drain voltage of the MOSFET are negative, namely in a direction from the source to the drain, just prior to the turn-off of the active MOSFET. When the MOSFET is then turned off, current is diverted from the active device to its integral body diode, and flows through the body diode until the other power MOSFET is turned on. Because the body diode stores a quantity of charge that is proportional to the diode forward conduction current, the body diode stores a great amount of charge while forward conducting, on the order of microcoulombs, and the other of the two MOSFETs must recover this charge when it is turned on so that its drain-to-source potential will fall. Because the power MOSFETs typically have a high transconductance, they can only sustain this very large drain current without damage for a very short period of time. As an example, the current transients may be in excess of 100 A when generated by an IRFC250, size 5, 200 V power MOSFET using a 15–20 V gate drive.

More particularly, FIG. 7 illustrates the operation of the body diodes 104, 105 of power MOSFETs 101 and 102 in the half-bridge circuit of FIG. 1 and shows the direction of the current flow. Here, body diode 105 conducts current after MOSFET 102 is turned off and while MOSFET 101 remains off. When MOSFET 101 is then turned on, the MOSFET must recover all of the charge stored in body diode 105 before the output Vs can increase. The combination of the charge stored in body diode 105 as well as the reverse-bias dV/dt can cause catastrophic failure of MOSFET 102 and its body diode 105.

This phenomenon is known as dV/dt-induced failure and is caused by the turn-on of a parasitic NPN transistor formed by the planar structure of the power MOSFET shown in FIG. 8. The highly undesirable, high current dV/dt induced failure is a particular drawback to the half-bridge circuit.

SUMMARY OF THE INVENTION

The present invention provides for soft turn-on of power transistors so that current transients are reduced.

According to an aspect of the present invention, a circuit drives first and second power transistors arranged in series in a half-bridge configuration. A first switch circuit supplies a voltage barely above the threshold voltage to the first power transistor. A second switch circuit supplies the supply voltage to the first power transistor. A timing circuit gates on one of the switch circuits and gates off the other of the switch circuits. When there is a change in state in an input voltage, the first switch circuit is initially turned on and the second switch circuit is initially off. After a predetermined interval, the first switch circuit is turned off and the second switch circuit is turned on. As a result, there is a soft turn-on of the first power transistor and current transients in the second power transistor are reduced.

In accordance with this aspect of the present invention, a third switch circuit may pull down the gate of the first power transistor to its source potential when there is a further change of state in the input voltage.

Furthermore, the second switch circuit may include an amplifier circuit and a voltage reference circuit. The amplifier may include a transistor in a common drain configuration, and the voltage reference circuit may include a steady state bias current source, and a transistor switch and zener diode for controlling the common drain configured transistor. The timing circuit may include a pulse generator circuit that generates a pulse for the predetermined interval during which the first switch circuit is turned on and the second switch circuit is turned off. When this pulse is terminated, the first switch circuit is turned off and the second switch circuit turned on.

According to another aspect of the present invention, a method of driving first and second power transistors arranged in series in a half-bridge configuration responds to a change of state in an input voltage by supplying a voltage barely above the threshold voltage to the first power transistor. The supply voltage is then supplied to the first power transistor for the remainder of the interval until the input voltage further changes state. As a result, the first power transistor is provided with a soft turn-on and transient currents in the second power transistor are reduced.

In accordance with this aspect of the present invention, the first power transistor is turned off when the input voltage further changes state. A pulse may be generated during the predetermined interval and initiates supplying the first power transistor with a voltage barely above its threshold value. When the pulse terminates, the supply voltage is then delivered to the first power transistor.

According to a further aspect of the present invention, a circuit turns on and off an MOS-gated power transistor.

According to a still further of the present invention, a method turns on and off an MOS-gated power transistor.

Other features and advantages of the present invention will become apparent from the following description of the invention which refers to the accompanying drawings.

BRIEF DESCRIPTION OF THE DRAWINGS

FIGS. 5A–5D are diagrams showing the waveforms of the known resonant-mode power supply circuit of FIG. 1 for an operating frequency less than the resonant frequency;

FIGS. 9C and 9D are diagrams showing the gate driver waveforms with a turn-on gate drive "step" as generated by the circuit of the present invention;

DETAILED DESCRIPTION OF THE INVENTION

As is known, the current transients that flow in the body diode of a respective power MOSFET when the other MOSFET is turned on are minimized by reducing the gate drive voltage. At lower gate drive voltages, the drain current of the MOSFET is proportional to $(V_{GS}-V_{TH})^2$ and is defined by the following relation:

$$I_D \approx \frac{\mu C_{ox}}{2} \frac{W}{L} (V_{GS} - V_{TH})^2 \qquad (2)$$

Thus, a significantly lower drain current transient can be obtained by reducing the gate drive potential.

As an example, reducing the gate drive voltage from 15 V to 8 V in an IRF640 device reduces its saturation drain current from about 100 A to approximately 35 A. As a result, the supply voltage to the gate driver IC may be lowered from 15–20 V to 8 V (regulated), essentially eliminating dV/dt-induced failures in the resonant-mode power supply.

Figure 1:
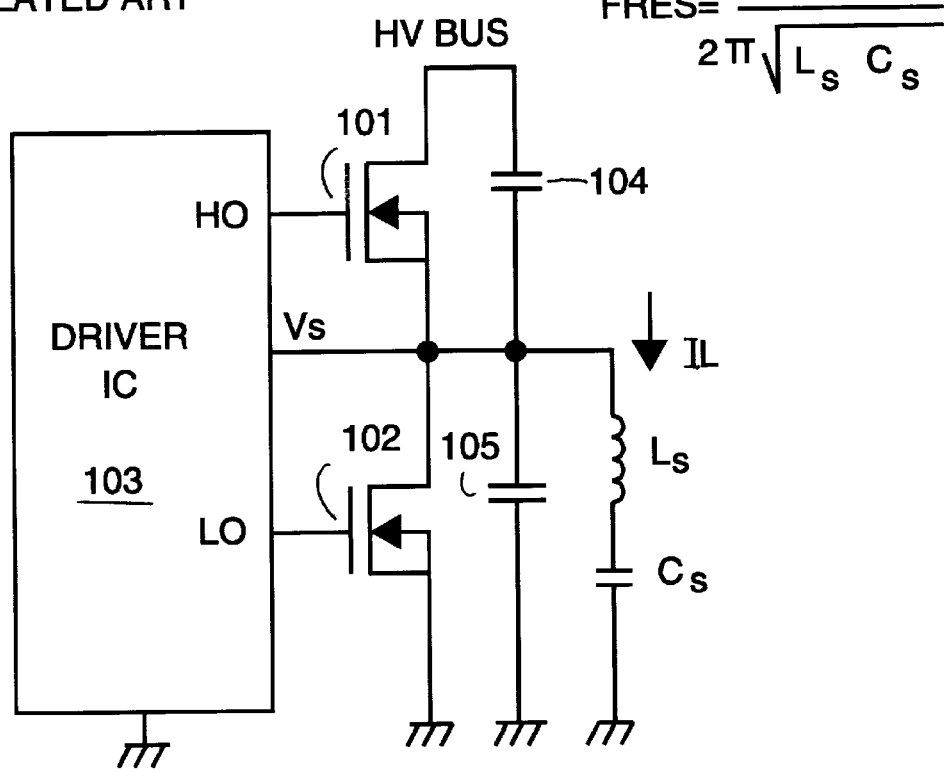
FIG. 1 is a circuit diagram showing a known resonant-mode power supply circuit.
Figure 2:
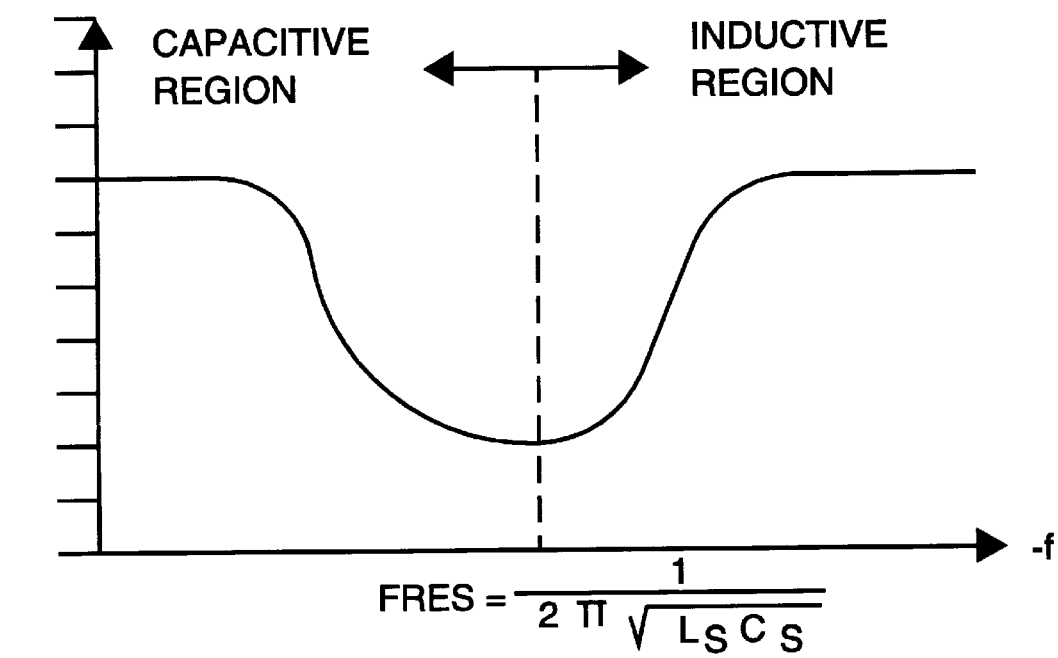
FIG. 2 is a diagram showing the impedance characteristics of the known resonant-mode power supply circuit of FIG. 1.
Figure 3A:
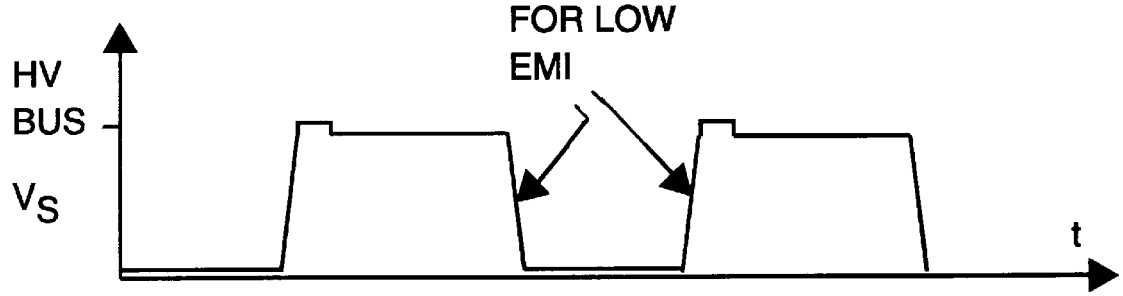
FIGS. 3A–3D are diagrams showing the waveforms of the known resonant-mode power supply circuit of FIG. 1.
Figure 3B:
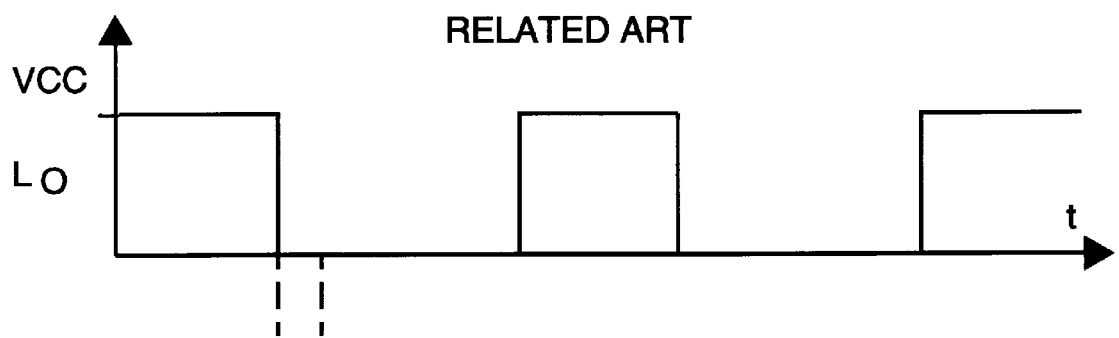
Figure 3C:
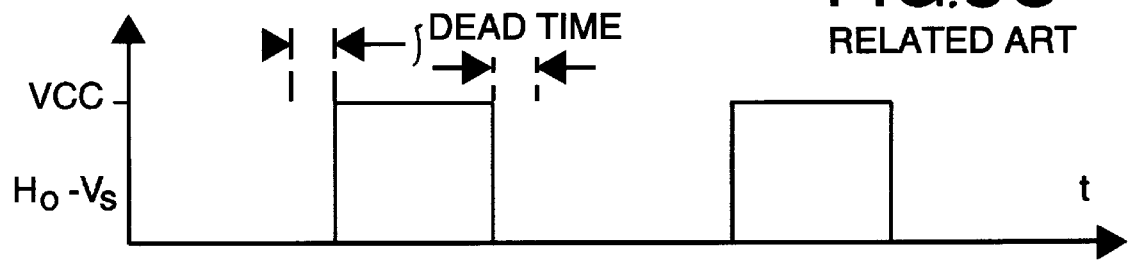
Figure 3D:
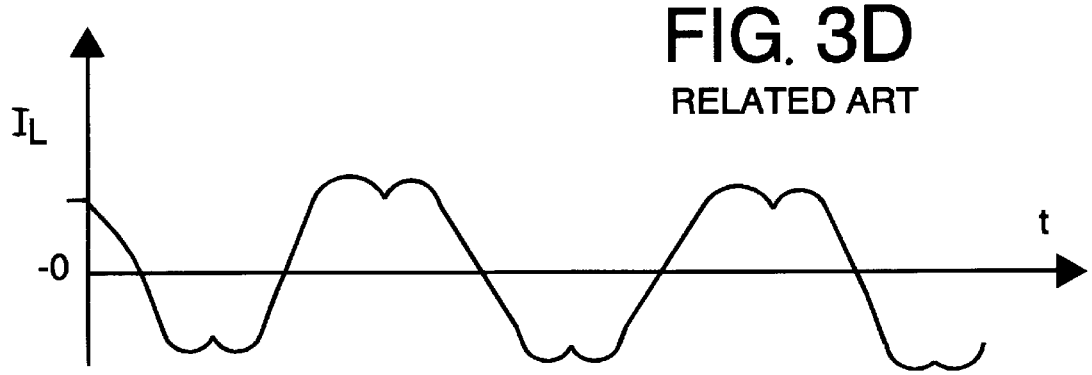
Figure 4A:
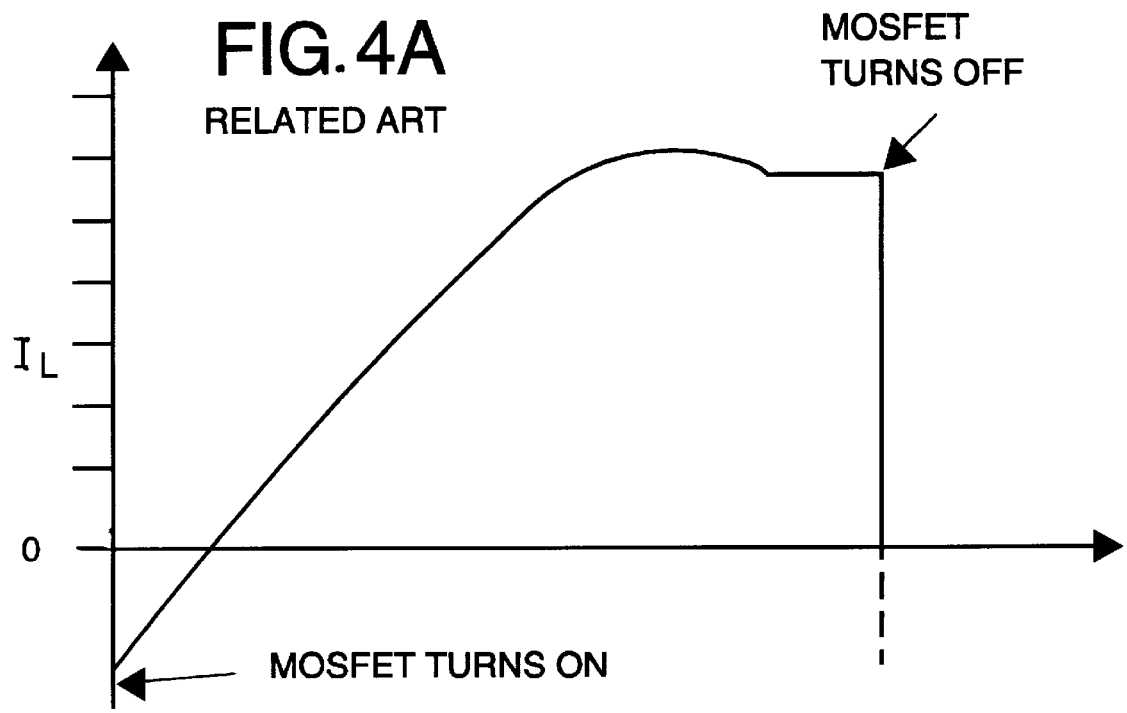
FIGS. 4A–4B are diagrams showing the frequency drain current and drain voltage characteristics, respectively, of the known resonant-mode power supply circuit of FIG. 1 for an operating frequency greater than the resonant frequency.
Figure 4B:
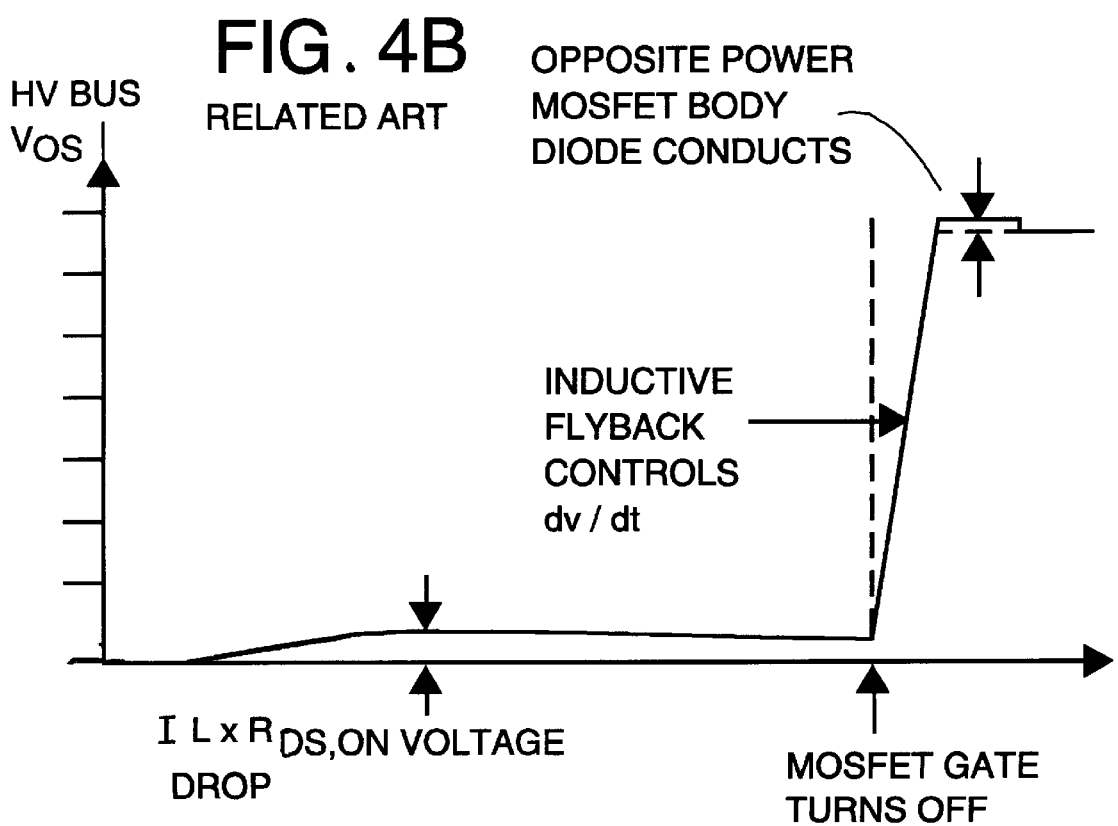
Figure 6A:
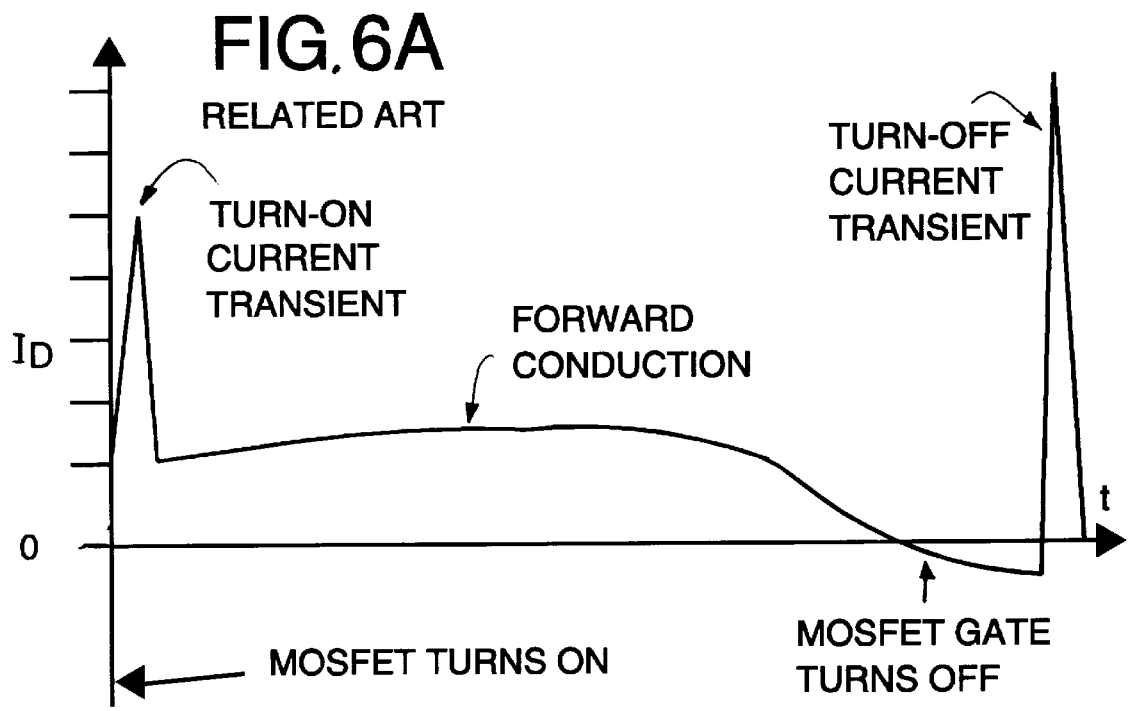
FIGS. 6A–6B show the drain current and voltage characteristics, respectively, for an operating frequency less than the resonant frequency.
Figure 6B:
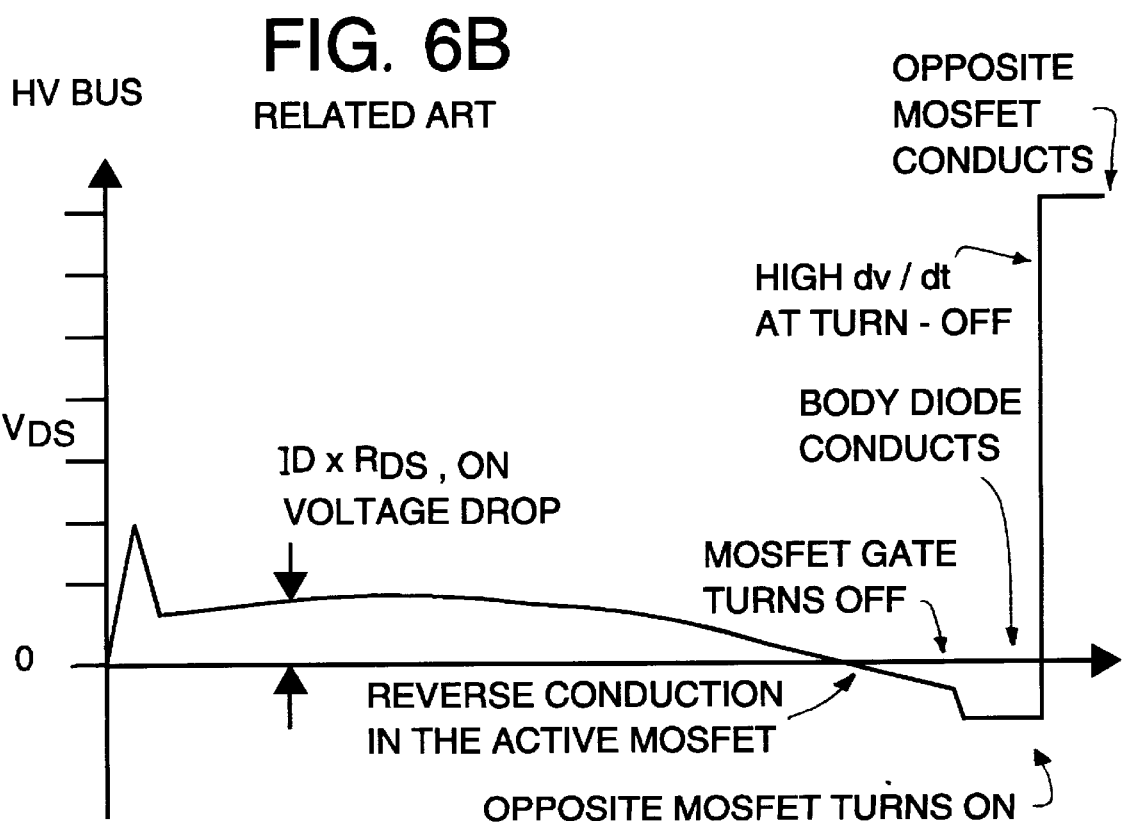
Figure 7:
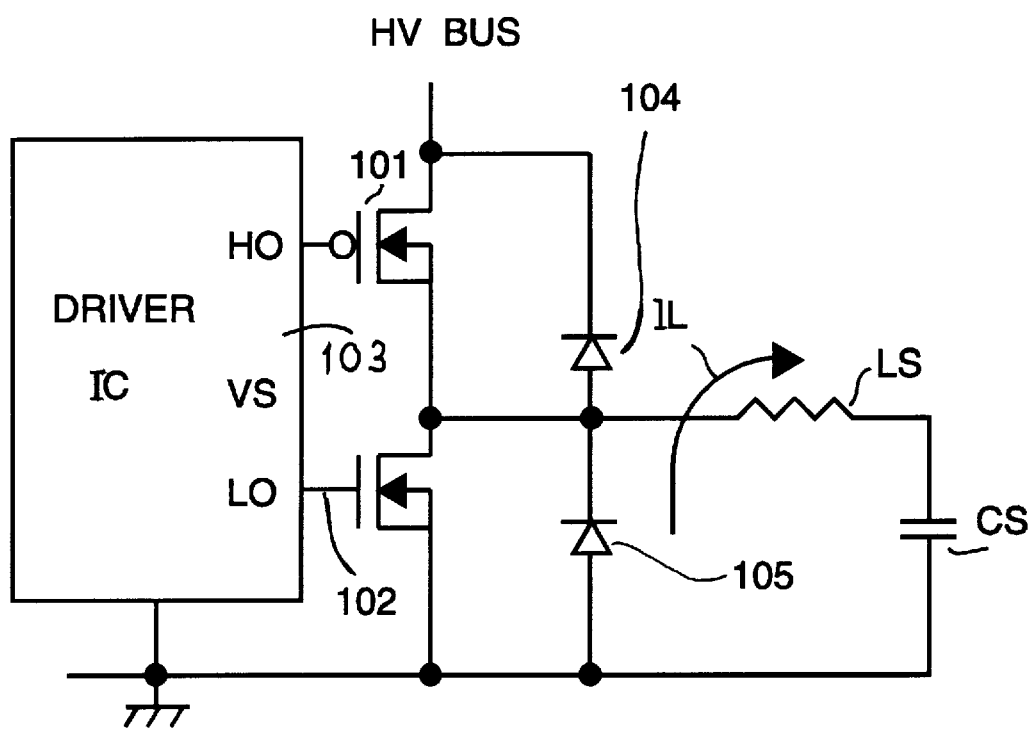
FIG. 7 is a circuit diagram illustrating the half-bridge circuit and the direction of current flow through the circuit of FIG. 1.
Figure 8:
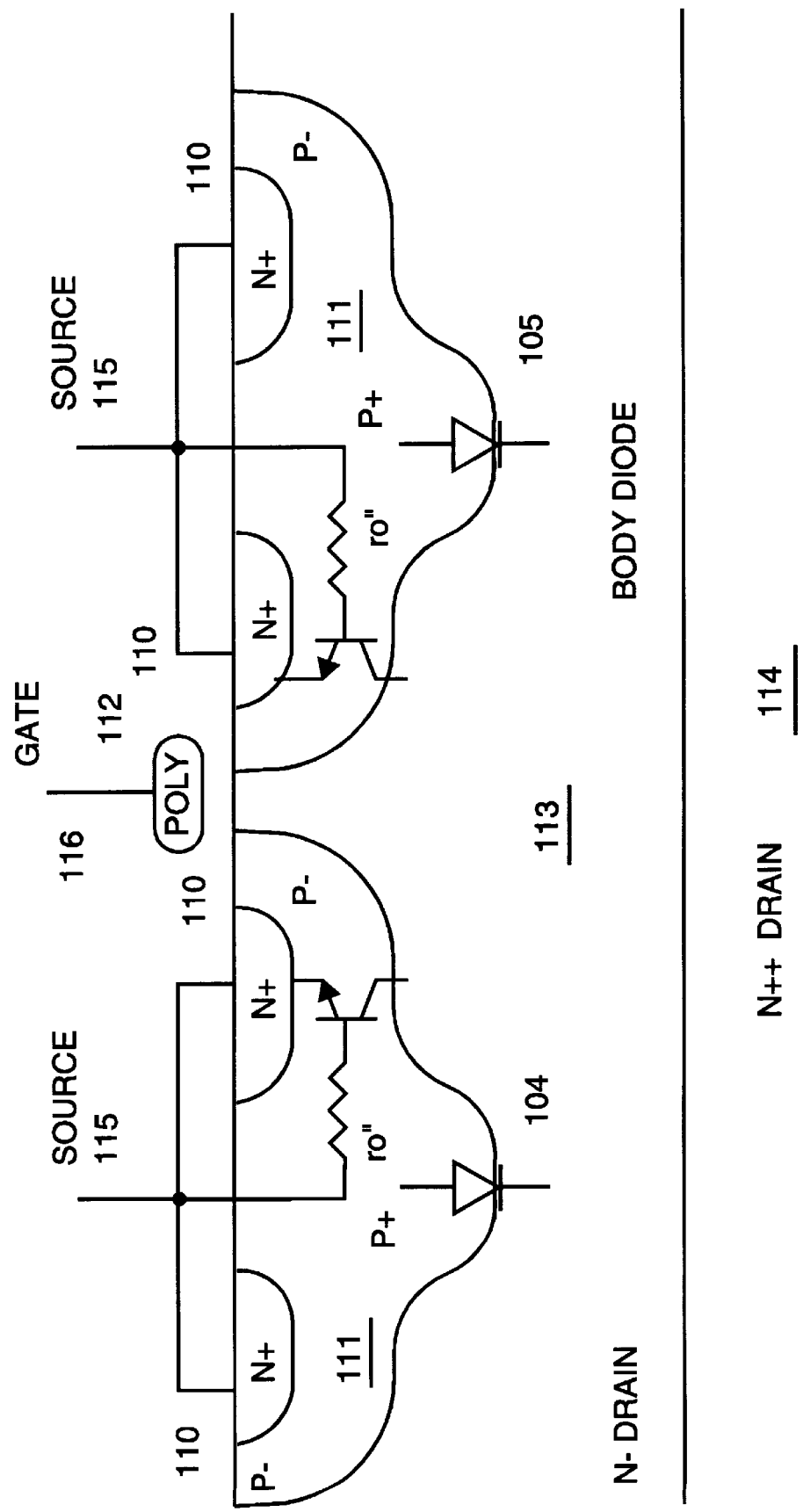
FIG. 8 is a diagram showing the structure of a vertical conduction power MOSFET employed in the circuit of FIG. 1, including the parasitic NPN and the integral body diode.
Figure 9A:
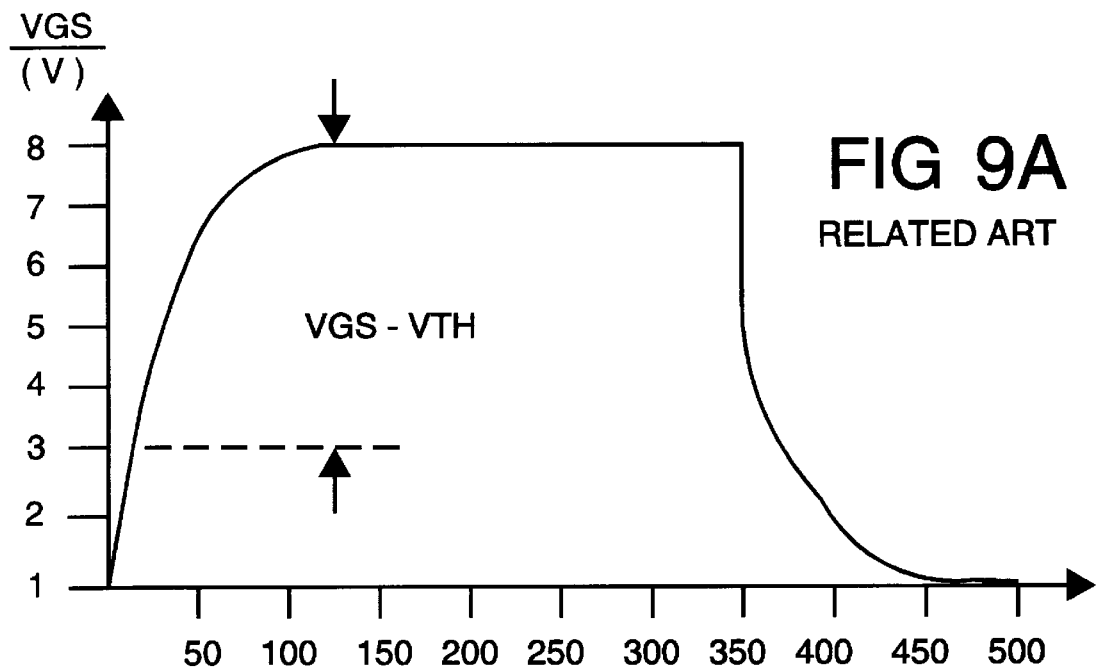
FIGS. 9A and 9B are diagrams showing the gate drive waveforms for a square wave gate drive signal.

In accordance with the present invention, the specific gate drive waveform is modified so that the gate voltage is gradually raised to provide a "soft turn-on" that reduces the current transients in the power MOSFET. Specifically, when the MOSFET is turned on, the gate voltage of the MOSFET is initially raised to a value slightly above its threshold voltage and then is subsequently raised to its full value, as shown in FIGS. 9C–9D. As a result of this soft turn-on of the MOSFET, the drain current transient is significantly lower than when the MOSFET is simply fully turned on, as shown in FIGS. 9A–9B.

Figure 10:
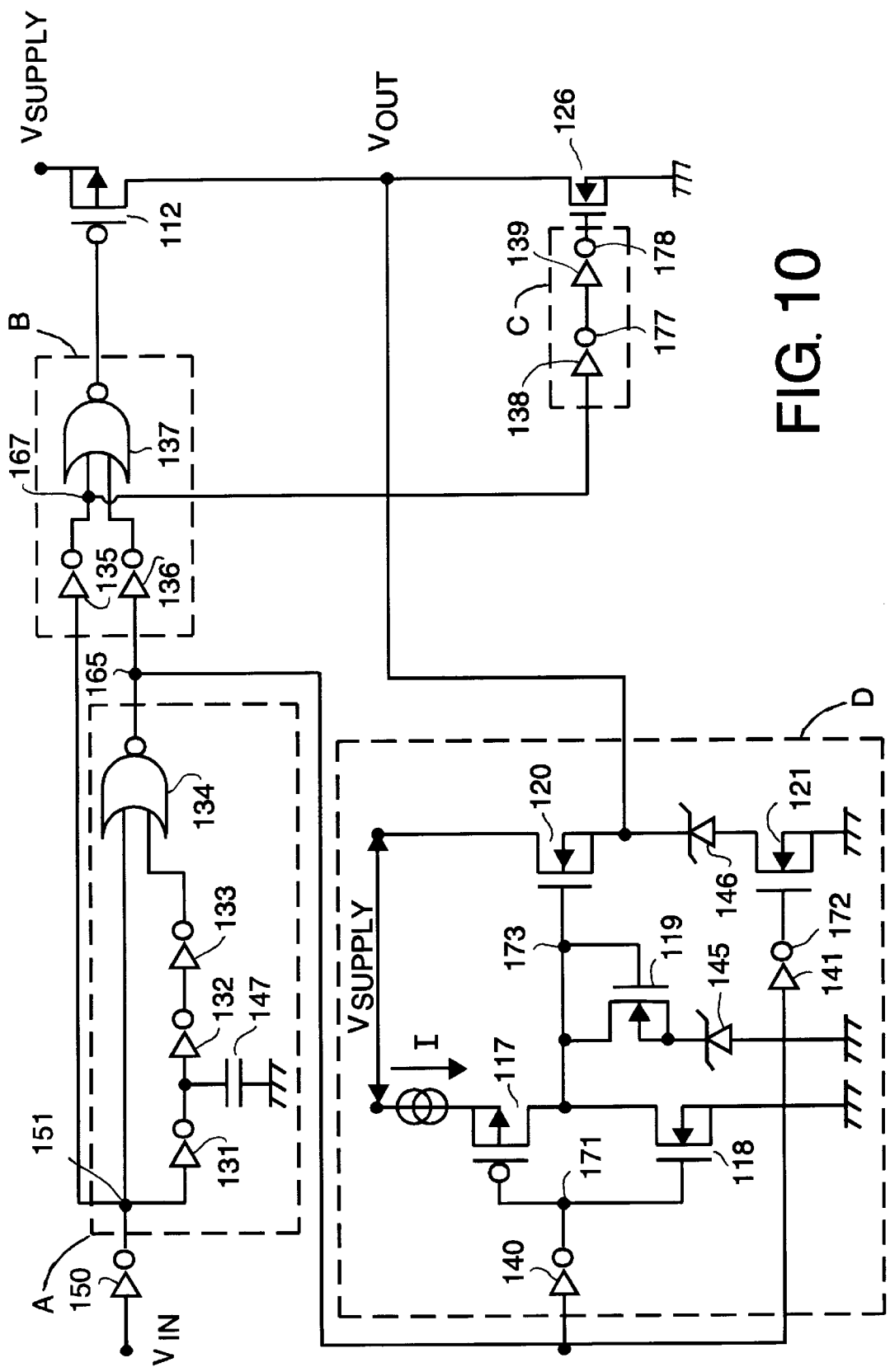
FIG. 10 is a schematic diagram showing the gate drive step generator circuit according to a preferred embodiment of the present invention.
Figure 11:
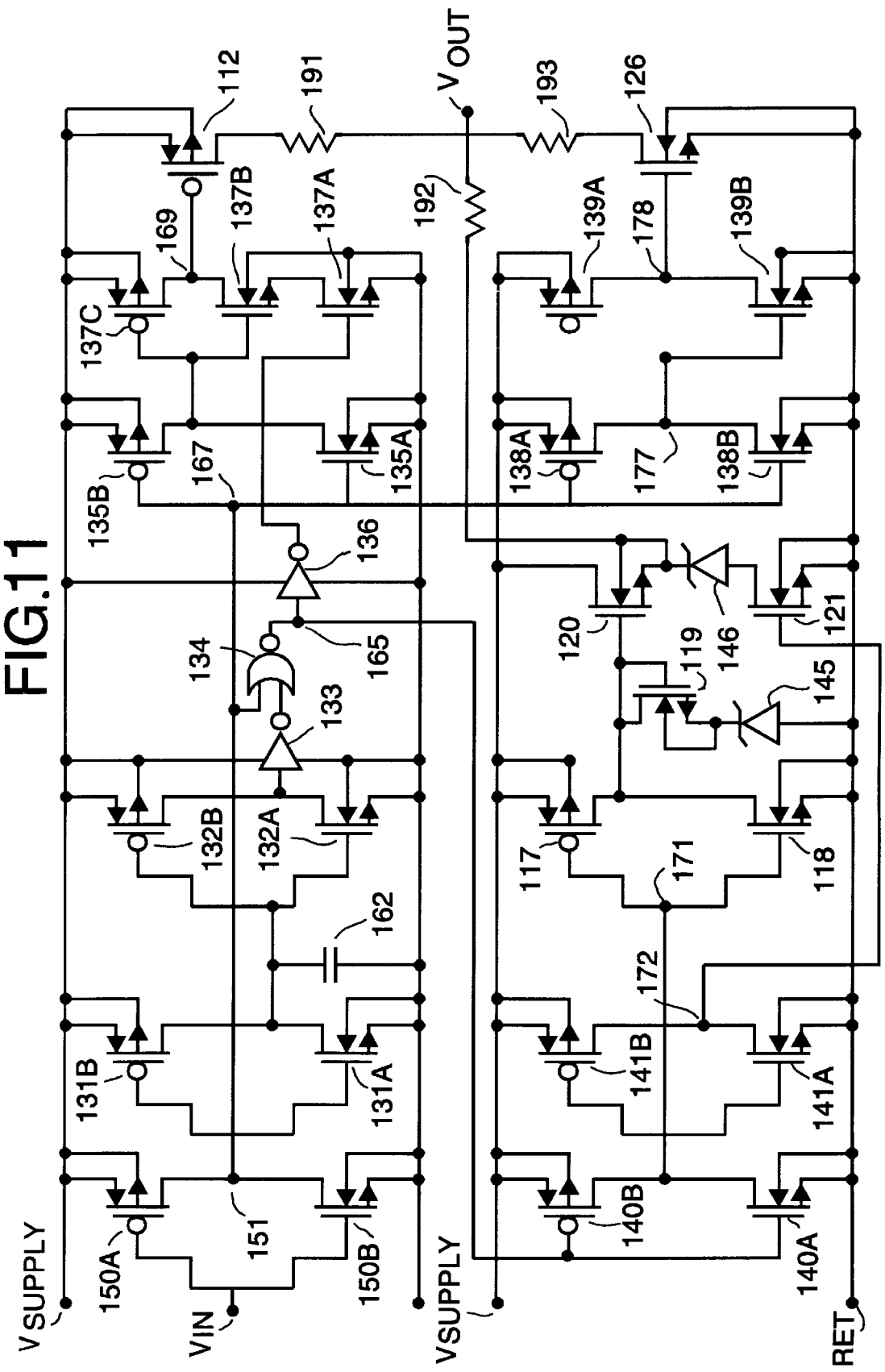
FIG. 11 is a schematic diagram showing the circuit of FIG. 10 in greater detail.

FIGS. 10 and 11 are block diagrams of the preferred embodiment of the gate drive step generator circuit that supplies a soft turn-on gate drive waveform to a power MOSFET (not shown), such as the power MOSFET in a half-bridge circuit, according to the present invention. The generator circuit includes: a one-shot pulse generator stage (A), a PMOS pull-up output stage (B), a NMOS pull-down output stage (C), and a NMOS pull-up output stage (D).

Figure 9B:
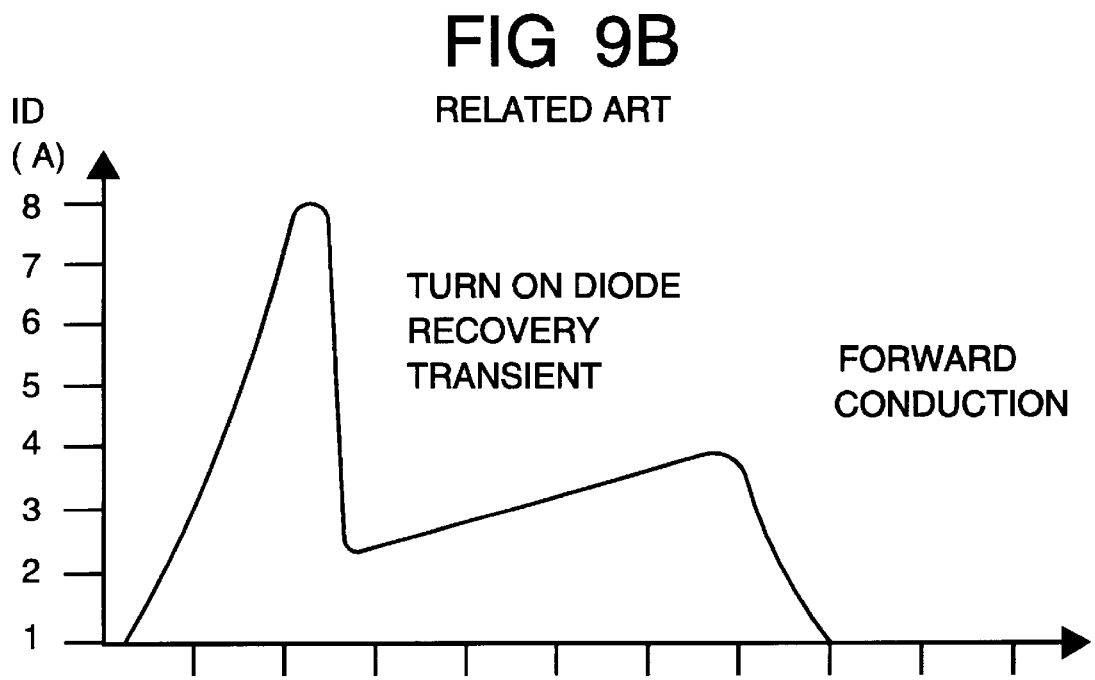

Ordinarily, the gate drive step generator circuit is capable of only generating a "hard" square wave output waveform, shown in FIGS. 9A–9B, and consists only of stages B and C. However, in the circuit of the present invention, output stage D is added for generating the soft turn-on waveform, along with a timing circuit (stage A) for gating on one of the other stages and for gating off the remaining stages.

The output stage D comprises a class A NMOS amplifier and a temperature-stable zener diode voltage reference. The class A amplifier includes a transistor 120 in a common drain configuration, and the temperature-stable voltage reference includes a zener diode 145. Zener diode 146, MOSFETs 119 and 121, and the bias current I together control the current that flows in a MOSFET 120 for a capacitive load in a steady state.

The gate drive step generator circuit of the present invention is shown in greater detail in FIG. 11.

Referring back to the simplified circuit diagram of FIG. 10, when input voltage $V_{IN}$ goes high, namely, when it is desired that the output voltage $V_{OUT}$ supplied to the gate of a power MOSFET (not shown) be raised from low to high in a manner that provides for a soft turn-on of the power MOSFET, the gate drive step generator circuit generates a step voltage waveform according to the following steps:

1. The pulse generator stage A generates a positive pulse at node 165. The duration of this pulse is determined by the value of capacitor 147 and the output impedance of inverter 131. For the duration of this pulse, inverters 135 and 136, along with AND gate 137, hold MOSFET 112 in an off state. At the same time, the pulse at node 165 turns on MOSFET 120 which raises the output voltage $V_{OUT}$ to approximately 5–6 V.

2. At the conclusion of the pulse at node 165, transistor 120 is turned off, and transistor 112 is turned on. The output voltage is thus raised from 5–6 V to the value of the supply voltage which, preferably, is 8 V to 10 V.

When $V_{IN}$ goes low, namely when it is desired that the state of the output voltage $V_{OUT}$ be changed from high to low, transistor 112 turns off, transistor 126 turns on thus pulling down the output voltage $V_{OUT}$, and transistor 120 remains off.

As a result, during turn-on of the power MOSFET, the class A amplifier combined with a voltage reference pulls the gate voltage of a power MOSFET to a value just above its threshold voltage to limit its peak drain current transient. Though other known circuits include a class A amplifier and voltage reference to protect the gate of a power MOSFET from excessive voltage, these circuits limit the gate voltage to a range of the 15–20 V range, but do not control the drain current transient.

Referring back to Equation (2), the present invention restricts the term $(V_{GS}-V_{TH})$ to a low value so that the drain current is maintained at a safe level. More particularly, the zener diode voltage reference 145, along with MOSFETs 119 and 120, restrict the value of $(V_{GS}-V_{TH})$. Therefore, when MOSFETs 119 and 120 are on, the output voltage is:

$$V_{OUT}=V_{D145}+V_{GS119}-V_{GS120} \quad (3)$$

If transistor 119 is sized properly, namely, if it is sufficiently large, then the voltage drop $V_{GS119}$ across MOSFET 119 is approximately $V_{TH}$ and follows the relation:

$$V_{GS119} = \left( \frac{2I_{D119}}{\mu C_{ox}} \frac{W}{L} \right)^{1/2} + V_{TH}, \quad (4)$$

where $I_{D119}=I_{D117}$, and $I_{D117}$ and the value of W/L of MOSFET 119 are chosen so that the left-hand term of the right-hand side of Equation (4) is small, namely 0.1–0.5 V.

The zener diode 145 has a breakdown voltage of approximately 5.1 V, and has a low temperature coefficient, typically less than 100 ppm/° C. As a result, the level of the output voltage $V_{OUT}$ is slightly higher than the zener breakdown voltage of diode D1.

Because the threshold voltage of the power MOSFET that is being driven is approximately 3 V, the $(V_{GS}-V_{TH})$ term of Equation (2) is approximately:

$$V_{GS}-V_{TH} \approx 5.5-3.0=2.5 \text{ V.}$$

Without the Class A amplifier and voltage reference circuitry that comprise stage D of the present invention, this term is:

$$V_{GS}-V_{TH}=8.0 \text{ V}-3.0 \text{ V}=5.0 \text{ V.}$$

Because the drain current is proportional to $(V_{GS}-V_{TH})^2$, the two-fold reduction in $(V_{GS}-V_{TH})$ by the added stage D reduces the peak current transient by a factor of approximately 4. As a result, the present invention provides a much greater margin of safety in the power supply circuit.

Alternatively, a class AB, or Class B amplifier can be used to provide the soft turn-on step of pulling the output of the gate drive step generation circuit to its intermediate level.

Although the present invention has been described in relation to particular embodiments thereof, many other variations and modifications and other uses will become apparent to those skilled in the art. It is preferred, therefore, that the present invention be limited not by the specific disclosure herein but only by the appended claims.

What is claimed is:

1. A circuit for driving a power transistor, said circuit comprising:

a first switch circuit for supplying a first gate drive voltage to the gate of said power transistor, said first gate drive voltage having a value slightly above the threshold voltage of the power transistor;

a second switch circuit for supplying a second gate drive voltage to the gate of said power transistor, said second gate drive voltage being a supply voltage; and a timing circuit for gating on one of said first and second switch circuits and for gating off the other of said first and second switch circuits, such that when there is a change of state in an input voltage, said first switch circuit is initially turned on and said second switch circuit is initially turned off, and after a predetermined interval, said first switch circuit is turned off and said second switch circuit is turned on, thereby providing a soft turn-on of said power transistor and reducing current transients.

2. The circuit of claim 1 wherein the power transistor is a first one of first and second power transistors arranged in series in a half-bridge configuration, wherein said circuit provides a soft turn-on of said first power transistor and reduces current transisents in said second power transistor.

3. The circuit of claim 1 further comprising a third switch circuit for pulling down the voltage supplied to said gate of said power transistor to its source potential when there is a further change of state in said input voltage, so that said power transistor is turned off.

4. The circuit of claim 3, wherein said second switch circuit is gated off when said input voltage further changes state.

5. The circuit of claim 1 wherein said second switch circuit includes an amplifier circuit and a voltage reference circuit.

6. The circuit of claim 5 wherein said amplifier includes a transistor in a common drain configuration.

7. The circuit of claim 6 wherein said voltage reference circuit includes a steady state bias current source, and a control circuit for controlling said common drain configured transistor.

8. The circuit of claim 1 wherein said timing circuit includes a pulse generator circuit that generates a pulse for the duration of said predetermined interval that initiates the turning on of said first switch circuit.

9. The circuit of claim 8 wherein when said pulse is terminated by said pulse generator circuit, said first switch is turned off and said second switch is turned on so that said second gate drive voltage is supplied to the gate of said power transistor.

10. A method of driving a power transistor, said method comprising the steps of:

responding to a change of state in an input voltage by delivering, for a predetermined interval, a first gate drive voltage to the gate of the power transistor, said first gate drive voltage having a value slightly above the threshold voltage of the power transistor, and delivering, until said input voltage further changes state, a second gate drive voltage to the gate of the power transistor, said second gate drive voltage being a supply voltage, said first and second voltages thereby providing a soft turn-on of the power transistor and reducing transient current.

11. The method of claim 10 wherein the power transistor is a first one of first and second power transistors arranged in series in a half-bridge configuration, wherein said circuit provides a soft turn-on of said first power transistor and reduces current transisents in said second power transistor.

12. The method of claim 10 further comprising the step of turning off the first power transistor when said input voltage further changes state.

13. The method of claim 10 wherein a pulse is generated for the duration of said predetermined interval and which initiates supplying said first gate drive voltage to the gate of said power transistor.

14. The method of claim 13 wherein the termination of said pulse at the end of said predetermined interval initiates supplying the second gate drive voltage to the gate of said power transistor.

15. A circuit for turning on and off an MOS-gated power transistor, said circuit comprising:

a first switch circuit for supplying a first gate drive voltage to said MOS-gated power transistor, said first gate drive voltage having a value slightly above the threshold voltage of said MOS-gated power transistor;

a second switch circuit for supplying a second gate drive voltage to said gate of said MOS-gated power transistor, said second gate drive voltage being a supply voltage; and a timing circuit for gating on one of said first and second switch circuits and for gating off the other one of said first and second switch circuits such that when there is a change of state in an input voltage, said first switch circuit is initially turned on and said second switch circuit is initially turned off and, after a predetermined interval, said first switch circuit is turned off and said second switch circuit is turned on, thereby providing a soft turn-on of said MOS-gated power transistor and reducing current transients.

16. The circuit of claim 15 further comprising a third switch circuit for pulling down the voltage supplied to said gate of said MOS-gated power transistor to its source potential when there is a further change of state in said input voltage, so that said MOS-gated power transistor is turned off.

17. The circuit of claim 16, wherein said second switch circuit is gated off when said input voltage further changes state.

18. The circuit of claim 15 wherein said first switch circuit includes an amplifier circuit and a voltage reference circuit.

19. The circuit of claim 18 wherein said amplifier includes a transistor in a common drain configuration.

20. The circuit of claim 19 wherein said voltage reference circuit includes a steady state bias current source, and a transistor switch and a zener diode for controlling said common drain configured transistor.

21. The circuit of claim 15 wherein said timing circuit includes a pulse generator circuit that generates a pulse for the duration of said predetermined interval that initiates the turning on of said first switch circuit.

22. The circuit of claim 21 wherein when said pulse is terminated by said pulse generator circuit, said first switch circuit is turned off and said second switch circuit is turned on so that said second gate drive voltage is supplied to the gate of said power transistor.

23. A method of driving an MOS-gated power transistor, said method comprising the steps of:

responding to a change of state in an input voltage by supplying, for a predetermined interval, a first gate drive voltage to the gate of said MOS-gated power transistor, said first gate drive voltage having a value slightly above the threshold voltage of said MOS-gated power transistor; and supplying, until said input voltage further changes state, a second gate drive voltage to the gate of said MOS-gated power transistor, said second gate drive voltage being a supply voltage, thereby providing a soft turn-on of said MOS-gated power transistor and reducing transient voltages.

24. The method of claim 23 further comprising the step of turning off said MOS-gated power transistor when said input voltage further changes state.

25. The method of claim 23 wherein a pulse is generated for the duration of said predetermined interval which initiates supplying said first gate drive voltage to said gate of said first MOS-gated power transistor.

26. The method of claim 25 wherein termination of said pulse at the end of said predetermined interval initiates supplying said second gate voltage to said gate of said MOS-gated power transistor.

* * * * *